(12) United States Patent
Ashida et al.

(10) Patent No.: US 7,432,594 B2
(45) Date of Patent: Oct. 7, 2008

(54) SEMICONDUCTOR CHIP, ELECTRICALLY CONNECTIONS THEREFOR

(75) Inventors: Kisho Ashida, Hitachinaka (JP); Akira Muto, Haruna (JP); Ichio Shimizu, Tamamura (JP); Toshiyuki Hata, Maebashi (JP); Kenya Kawano, Hitachinaka (JP); Naotaka Tanaka, Kasumigaura (JP); Nae Hisano, Matsudo (JP)

(73) Assignee: Renesas Technology Corp., Tokyo (JP)

( * ) Notice: Subject to any disclaimer, the term of this patent is extended or adjusted under 35 U.S.C. 154(b) by 274 days.

(21) Appl. No.: 11/173,740

(22) Filed: Jun. 30, 2005

(65) Prior Publication Data

US 2006/0043618 A1 Mar. 2, 2006

(30) Foreign Application Priority Data

Aug. 30, 2004 (JP) ............................. 2004-250474

(51) Int. Cl.
*H01L 23/52* (2006.01)
*H01L 29/40* (2006.01)

(52) U.S. Cl. ...................... 257/735; 257/750; 257/773; 257/776; 257/E23.014

(58) Field of Classification Search ................. 257/750, 257/735, 773, 776, E23.014
See application file for complete search history.

(56) References Cited

U.S. PATENT DOCUMENTS

2003/0122232 A1* 7/2003 Hirano et al. ............... 257/678
2005/0077599 A1* 4/2005 Miura et al. ................ 257/669

FOREIGN PATENT DOCUMENTS

JP 2003-086737 3/2003

* cited by examiner

*Primary Examiner*—Ngan Ngo
(74) *Attorney, Agent, or Firm*—Townsend and Townsend and Crew LLP

(57) ABSTRACT

A semiconductor device has a semiconductor chip including first and second surfaces opposed to each other in a thickness direction of the semiconductor chip, wherein the first and second surfaces include first and second electrode surfaces respectively, and first and second electrically conductive members covering the first and second electrode surfaces respectively as seen in the thickness direction to be electrically connected to the first and second electrode surfaces respectively.

18 Claims, 9 Drawing Sheets

THICKNESS DIRECTION

SEMICONDUCTOR CHIP, ELECTRICALLY CONNECTIONS THEREFOR

INCORPORATION BY REFERENCE

The present application claims priority from Japanese application JP2004-250474 filed on Aug. 30, 2004, the content of which is hereby incorporated by reference into this application.

BACKGROUND OF THE INVENTION

The present invention relates to a semiconductor device including a semiconductor chip and at least one electrically conductive (metallic) member electrically connected to the semiconductor chip.

In a prior art semiconductor device disclosed by JP-2003-86737-A, one of surfaces of a semiconductor chip opposed to each other in a thickness direction of the semiconductor chip is joined with an electrically conductive member (lead frame), and the other one of the surfaces has a solder bump.

BRIEF SUMMARY OF THE INVENTION

An object of the present invention is to provide a semiconductor device in which a semiconductor chip can be effectively cooled, and/or a breakage of at least one of the semiconductor chip and a boundary between the semiconductor chip and an electrically conductive (metallic) member electrically connected to the semiconductor chip can be restrained.

According to the invention, a semiconductor device comprising, a semiconductor chip (whose main component is semiconductor material such as silicon) including first and second surfaces opposed to each other in a thickness direction of the semiconductor chip, wherein the first and second surfaces include first and second electrode surfaces respectively, and first and second electrically conductive (metallic) members covering the first and second electrode surfaces respectively as seen in the thickness direction to be electrically connected to the first and second electrode surfaces respectively.

Since the first and second electrically conductive (metallic) members covering the first and second electrode surfaces respectively as seen in the thickness direction, the semiconductor chip can be effectively cooled.

If the semiconductor device further comprising a sealing member (whose main component is a (synthetic) resin) fixed to at least a part of each of the semiconductor chip, first electrically conductive member and second electrically conductive member, a stress in the semiconductor device is distributed among the sealing member, semiconductor chip, first electrically conductive member and second electrically conductive member so that a breakage of at least one of the semiconductor chip and a boundary between the semiconductor chip and each of the first electrically conductive member and second electrically conductive member can be restrained. If a surface of a part of each of the first and second electrically conductive members which part overlaps respective one of the first and second electrode surfaces as seen in the thickness direction and which surface is opposed to the respective one of the first and second electrode surfaces (through the each of the first and second electrically conductive members) in the thickness direction is prevented from being fixed to the sealing member, the surface of the part of one of the first and second electrically conductive members is capable of contacting or being exposed to the atmosphere to be cooled effectively (when (the surface of the part of) the other one of the first and second electrically conductive members contacts another electrically conductive member to be electrically connected to each other). If a surface of a part of at least one of the first and second electrically conductive members which part overlaps corresponding (covering) one of the first and second electrode surfaces as seen in the thickness direction and which surface is opposed to the corresponding one of the first and second electrode surfaces (through the one of the first and second electrically conductive members) in the thickness direction is prevented from being fixed to the sealing member, the surface of the part of one of the first and second electrically conductive members is capable of contacting or being exposed to the atmosphere to be cooled effectively (when (the surface of the part of) the other one of the first and second electrically conductive members contacts another electrically conductive member to be electrically connected to each other) or is fixed to the sealing member.

If a terminating end of each of the first and second electrically conductive members in a direction perpendicular to the thickness direction has side surfaces opposed to each other in the thickness direction and an end surface extending in the thickness direction between the side surfaces, and the side surfaces and the end surface are fixed to the sealing member, the terminating end is held by the sealing member in both directions opposed each other in the thickness direction and in the direction perpendicular to the thickness direction although the terminating end is separated from the semiconductor chip. If a terminating end of at least one of the first and second electrically conductive members in a direction perpendicular to the thickness direction is stair-shaped so that both surfaces of the terminating end opposite to each other through the at least one of the first and second electrically conductive members in the thickness direction and extending in the direction perpendicular to the thickness direction are fixed to the sealing member although another surface of the at least one of the first and second electrically conductive members adjacent to or at inside with respect to the surface in the direction perpendicular to the thickness direction is prevented from contacting or being fixed to the sealing member, first electrically conductive member and second electrically conductive member, the terminating end is held by the sealing member in the thickness direction.

If the sealing member is arranged between the semiconductor chip and a part of at least one (or each) of the first and second electrically conductive members in the thickness direction and is fixed to the semiconductor chip and the part of the at least one (or each) of the first and second electrically conductive members so that the sealing member, the semiconductor chip and the part of the at least one of the first and second electrically conductive members overlap each other at least partially as seen in the thickness direction, a load applied in the thickness direction between the semiconductor chip and (the electrically conductive member body of) the at least one of the first and second electrically conductive members is borne with both of another part of (the joint member of) the at least one of the first and second electrically conductive members which another part overlaps and contacts the semiconductor chip without passing through the sealing member in the thickness direction and the sealing member between the semiconductor chip and the part of (the electrically conductive member body of) the at least one of the first and second electrically conductive members in the thickness direction), so that a breakage of at least one of the semiconductor chip and a boundary between the semiconductor chip and each of the first electrically conductive member and second electrically conductive member can be restrained.

If the sealing member is arranged between the first and second electrically conductive members in the thickness direction and is fixed to the first and second electrically conductive members so that the sealing member adjacent to (contacting and/or surrounding closely) the semiconductor chip and the first and second electrically conductive members overlap each other (around the semiconductor chip) as seen in the thickness direction, a load applied in the thickness direction between the first and second electrically conductive members is borne with both of the semiconductor chip and the sealing member adjacent to (contacting and/or surrounding) or around the semiconductor chip, so that a breakage of at least one of the semiconductor chip and a boundary between the semiconductor chip and each of the first electrically conductive member and second electrically conductive member can be restrained.

If a thickness of a part of each of the first and second electrically conductive members which part overlaps respective one of the first and second electrode surfaces as seen in the thickness direction of the semiconductor chip is greater than a thickness of the semiconductor chip (through the first and second electrode surfaces), the semiconductor chip is effectively cooled through the each of the first and second electrically conductive members.

If each of the (metallic) first and second electrically conductive members has an electrically conductive (metallic) member body and an electrically conductive joint (metallic) member between the electrically conductive member body and respective one of the first and second electrode surfaces (so that the electrically conductive member body is electrically and mechanically connected to the respective one of the first and second electrode surfaces through the electrically conductive joint member), a melting point of the electrically conductive joint member is lower than that of the electrically conductive member body (and that of the first and second electrode surfaces), and a thickness of a part of the electrically conductive member body of at least one of the first and second electrically conductive members which part overlaps corresponding one of the first and second electrode surfaces as seen in the thickness direction is greater than a thickness of another part of the electrically conductive member body of the at least one of the first and second electrically conductive members which another part is prevented from overlapping the corresponding one of the first and second electrode surfaces as seen in the thickness direction, the semiconductor chip is effectively cooled through at least one of first and second electrode surfaces.

If each of the (metallic) first and second electrically conductive members has an electrically conductive (metallic) member body and an electrically conductive joint (metallic) member between the electrically conductive member body and respective one of the first and second electrode surfaces (so that the electrically conductive member body is electrically and mechanically connected to the respective one of the first and second electrode surfaces through the electrically conductive joint member), a melting point of the electrically conductive joint member is lower than that of the electrically conductive member body (and that of the first and second electrode surfaces), and in a cross section passing the semiconductor chip and the first and second electrically conductive members and taken along an imaginary plane parallel to the thickness direction, a difference between a distance between an innermost of a surface of the electrically conductive joint member (in a direction perpendicular to the thickness direction) of one of the first and second electrically conductive members and a terminating end of the semiconductor chip in a direction perpendicular to the thickness direction and another distance between an innermost of a surface of the electrically conductive joint member (in the direction perpendicular to the thickness direction) of the other one of the first and second electrically conductive members and the terminating end of the semiconductor chip in the direction perpendicular to the thickness direction is not more than at least one (greater one and/or smaller one) of the distance and the another distance, a stress concentration on a boundary between the semiconductor chip and each of the first and second electrically conductive members is restrained so that a breakage of at least one of the semiconductor chip and a boundary between the semiconductor chip and each of the first electrically conductive member and second electrically conductive member can be restrained.

If in a cross section passing the semiconductor chip and the first and second electrically conductive members and taken along an imaginary plane parallel to the thickness direction, a difference between a distance between an outer periphery of one of the first and second electrode surfaces and a terminating end of the semiconductor chip in a direction perpendicular to the thickness direction and another distance between an outer periphery of the other one of the first and second electrode surfaces and the terminating end of the semiconductor chip in the direction perpendicular to the thickness direction is not more than at least one (greater one and/or smaller one) of the distance and the another distance, a stress concentration on a boundary between the semiconductor chip and each of the first and second electrically conductive members is restrained so that a breakage of at least one of the semiconductor chip and a boundary between the semiconductor chip and each of the first electrically conductive member and second electrically conductive member can be restrained.

If a difference between a thickness of a part of one of the first and second electrically conductive members which part overlaps corresponding one of the first and second electrode surfaces as seen in the thickness direction and is opposed to the corresponding one of the first and second electrode surfaces (through the one of the first and second electrically conductive members) in the thickness direction and another thickness of a part of the other one of the first and second electrically conductive members which part overlaps the other corresponding one of the first and second electrode surfaces as seen in the thickness direction and is opposed to the other corresponding one of the first and second electrode surfaces (through the other one of the first and second electrically conductive members) in the thickness direction is smaller than a difference between the thickness of the semiconductor chip (between the first and second electrode surfaces) and at least one of the thickness of the part of the one of the first and second electrically conductive members and the another thickness of the part of the other one of the first and second electrically conductive members, a stress concentration on a boundary between the semiconductor chip and each of the first and second electrically conductive members is restrained so that a breakage of at least one of the semiconductor chip and a boundary between the semiconductor chip and each of the first electrically conductive member and second electrically conductive member can be restrained.

If at least one (or each) of the first and second electrically conductive members overlaps the whole of the semiconductor chip as seen in the thickness direction, the semiconductor chip is cooled effectively by the at least one (or each) of the first and second electrically conductive members. If at least one (or each) of the first and second electrically conductive members overlaps the whole of corresponding one of the first and second electrode surfaces as seen in the thickness direction, the semiconductor chip is cooled effectively by the at least one (or each) of the first and second electrically conductive members through the corresponding one of the first and second electrode surfaces. If at least one (or each) of the first and second electrically conductive members traverses an outer periphery of the semiconductor chip in two directions perpendicular to each other as seen in the thickness direction, the semiconductor chip is effectively cooled in the two directions. If at least one (or each) of the first and second electrically conductive members traverses an outer periphery of corresponding one of the first and second electrode surfaces in two directions perpendicular to each other as seen in the thickness direction, the semiconductor chip is effectively cooled in the two directions through the corresponding one of the first and second electrode surfaces.

If parts of the first and second electrically conductive members (overlapping each other as seen in the thickness direction) traverse an outer periphery of the semiconductor chip as seen in the thickness direction, and a thickness of each of the parts of the first and second electrically conductive members is greater than a thickness of the semiconductor chip (through the first and second electrode surfaces), a stress concentration at a center or radially inner area of the semiconductor chip as seen in the thickness direction is restrained. The center or radially inner area of the semiconductor chip is important in comparison with the outer periphery of the semiconductor chip, because the center or radially inner area includes electrical elements while the outer periphery of the semiconductor chip is prevented from including the electrical elements.

The semiconductor chip may include a transistor therein, and one of the first and second electrode surfaces is usable as a drain electrode, and the other one of the first and second electrode surfaces is usable as a source electrode so that a major part of electric current passing through the transistor passes through the first and second electrode surfaces. The first and second electrically conductive members may extend in the thickness direction so that at least one of the first and second electrically conductive members overlaps fully a thickness of the semiconductor chip as seen in a direction perpendicular to the thickness direction and the first and second electrically conductive members overlap each other at least partially as seen in the direction perpendicular to the thickness direction. It is preferable for cooling effectively the semiconductor chip through the first and second electrode surfaces that a surface of a part of each of the first and second electrically conductive members which part overlaps respective one of the first and second electrode surfaces as seen in the thickness direction and is opposed to the respective one of the first and second electrode surfaces (through the each of the first and second electrically conductive members) in the thickness direction is prevented from contacting a part of the semiconductor chip.)

Other objects, features and advantages of the invention will become apparent from the following description of the embodiments of the invention taken in conjunction with the accompanying drawings.

DETAILED DESCRIPTION OF THE INVENTION

Embodiment 1

Figure 1:
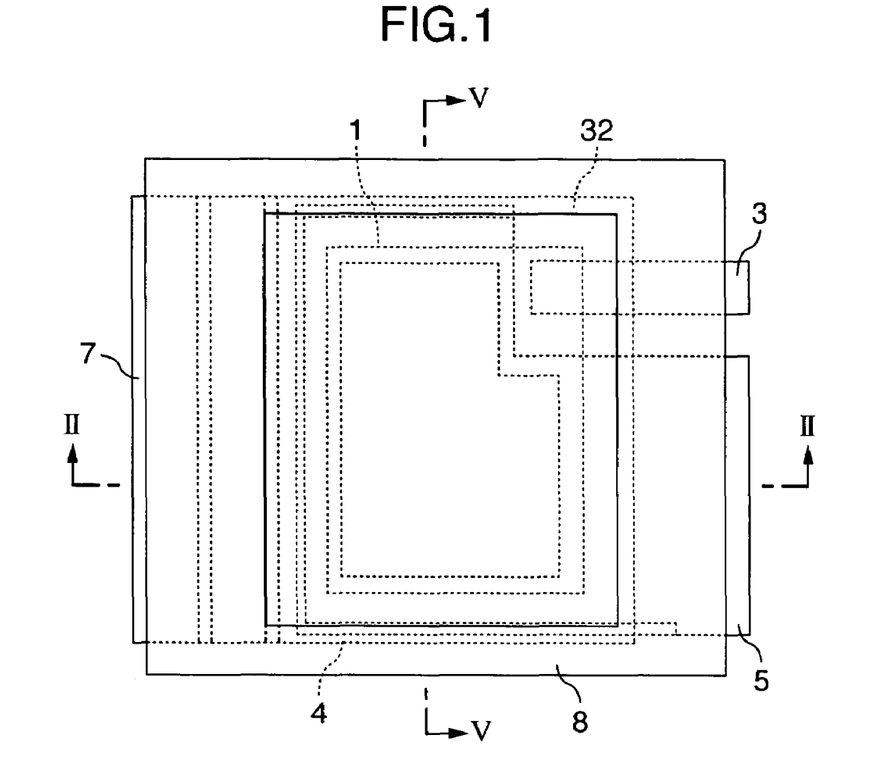
FIG. 1 is a front perspective view of a semiconductor device as a first embodiment of the invention.
Figure 2:
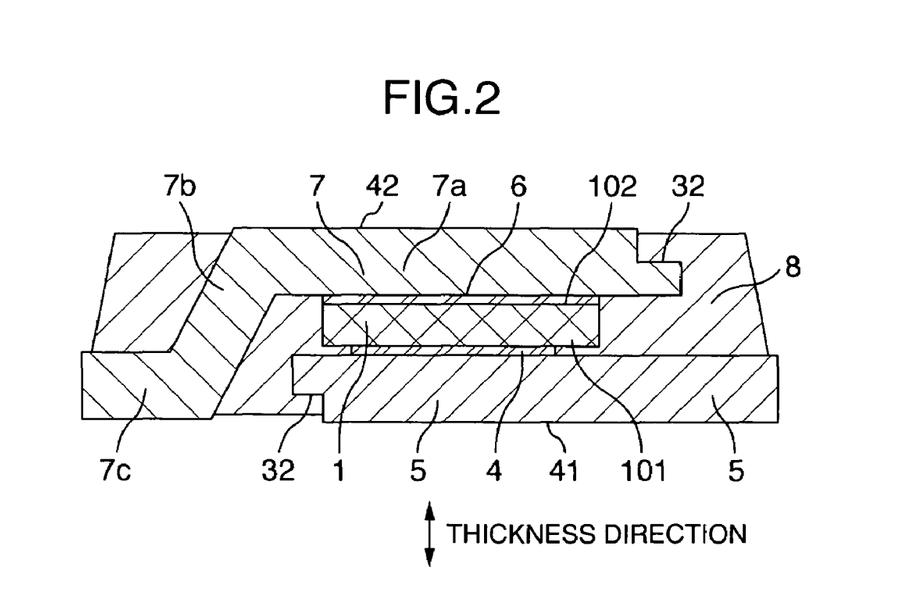
FIG. 2 is a cross sectional view of the semiconductor device taken along a line II-II in FIG. 1.
Figure 4A:
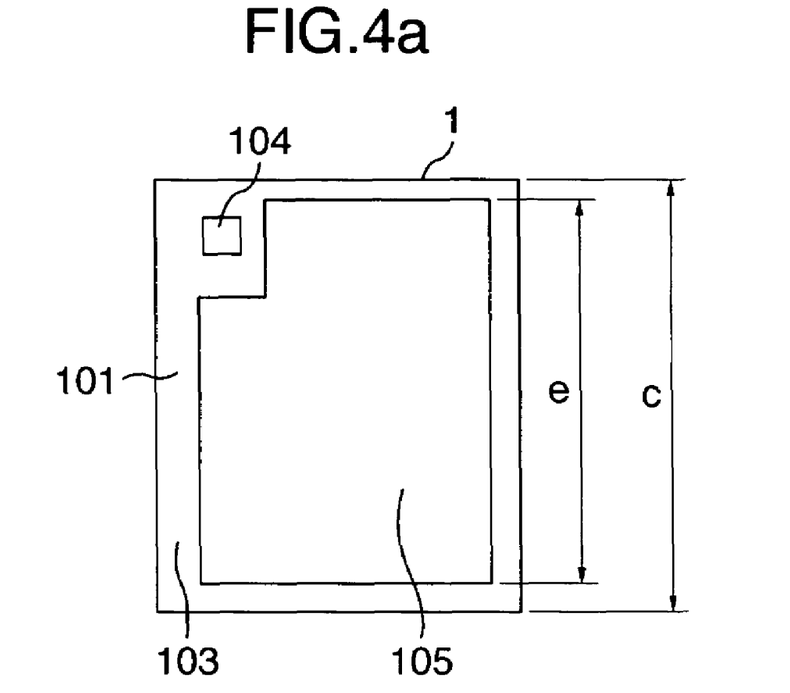
FIG. 4a is a front view of a semiconductor chip used in the first embodiment.
Figure 4B:
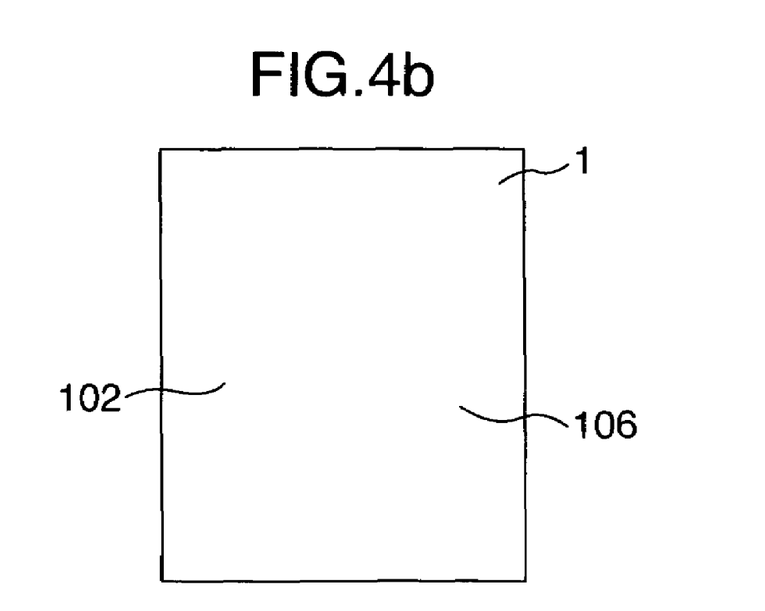
FIG. 4b is a reverse view of the semiconductor chip.

FIG. 1 is a perspective plane view of a semiconductor device as a first embodiment of the invention. FIG. 2 is a cross sectional view taken along II-II in FIG. 1. FIGS. 4a and 4b are plane view and bottom view showing schematically a structure of a semiconductor chip 1 usable in the semiconductor device.

At first, with using FIG. 4, the semiconductor chip 1 is explained. As shown in FIG. 4a, an insulating protect layer 103, an electrode for gate 104 and an electrode for source 105 are formed on a main surface (element forming surface, circuit forming surface) 101 of the semiconductor chip 1. The electrode for gate 104 and electrode for source 105 are separated from a peripheral edge (side) of the semiconductor chip 1, and the protect layer 103 is arranged between the peripheral edge of the semiconductor chip 1 and each of the electrode for gate 104 and electrode for source 105 and between the electrode for gate 104 and electrode for source 105. As shown in FIG. 4b, an electrode for drain 106 is formed on the whole of a reverse surface 102 opposite to the main surface 101. A reason of separating the electrode for source 105 inward from an end (peripheral edge) of the semiconductor chip 1 through the protect layer 103 is for preventing an electrical short through a side surface of the semiconductor chip 1 between after-mentioned joint member for drain 6 and joint member for source 4 when joining the semiconductor chip 1 and electrically conductive members (lead, header) with each other.

The semiconductor chip 1 is formed mainly by a semiconductor substrate made of, for example, a monocrystal silicon. Transistor elements such as MISFET (Metal Insulator Semiconductor Field Effect Transistor) are formed on a main surface of the semiconductor substrate. These MISFET are fine transistor cells connected in parallel to each other for increasing electric current therethrough.

The semiconductor chip 1 has a square shape in front view perpendicular to a thickness direction, for example, a rectangular shape in this embodiment.

Next, with using FIGS. 1 and 2, a structure of the whole of the semiconductor device is explained.

The semiconductor device of the embodiment, as shown in FIGS. 1 and 2, has the semiconductor chip 1, a resin sealing member 8, a lead for drain (electrically conductive member) 7, a lead for gate (electrically conductive member) 3, a header for source (electrically conductive member) 5 and so forth. The semiconductor chip 1, lead for drain 7, lead for gate 3 and header for source 5 are sealed with the resin sealing member 8.

The resin sealing member 8 is made of, for example, a thermosetting resin of epoxy type in which a phenol-type setting agent, silicone rubber, filler and so forth for decreasing a stress are added. Further, the resin sealing member 8 is formed by a transfer-molding process suitable for mass production. In the transfer-molding process, a die assembly (molding die) including a pot, runner, resin injection gate, cavity and so forth is used, and the thermosetting resin is injected into the cavity from the pot through the runner and the resin injection gate to form the resin sealing member.

The lead for drain 7 has, as shown in FIG. 2, a first part 7a above a reverse surface 102 of the semiconductor chip 1, a second part 7b monolithically extending from the first part 7a to a side of a main surface of the semiconductor chip 1m and third part 7c monolithically extending from the second part 7b below the main surface 101 of the semiconductor chip 1. The lead for drain 7 is formed by, for example, bending process.

In the lead for drain 7, the first part 7a is electrically and mechanically joined with an electrode for drain 106 (make reference to FIG. 4) of the semiconductor chip 1 through the connecting member for drain 6, and projects from the resin sealing member 8 to be exposed. The second part 7b is arranged in the resin sealing member 8. The third part 7c projects from the resin sealing member 8 to be exposed. This third part 7c extends around the semiconductor chip 1 to be separated away from the semiconductor chip 1 in the plane. The first part 7a has, as shown in FIG. 1, a size in plane greater than a size in plane of the semiconductor chip 1. The connecting member for drain 6 covers substantially the whole of the electrode for drain 106 in a manner different from, for example, a case in which a plurality of electrically conductive bumps (solder bumps, stud bumps, or the like) are distributed thereon.

The header for source 5 is arranged, as shown in FIG. 2, below the main surface of the semiconductor chip 1, joined electrically and mechanically with the electrode for source 105 (make reference to FIG. 4) of the semiconductor chip 1 through the connecting member for source 4, and projects from the resin sealing member 8 to be exposed. The header for source 5 has an outer peripheral shape greater than the electrode for source 105 of the semiconductor chip 1. The connecting member for source 4 covers substantially the whole of the electrode for source 105 in a manner different from, for example, a case in which a plurality of electrically conductive bumps (solder bumps, stud bumps, or the like) are distributed thereon.

The lead for gate 3 is arranged, as not shown in detail, below the main surface 102 of the semiconductor chip 1, and joined electrically and mechanically with the electrode for gate 104 of the semiconductor chip 1 through the connecting member for gate 2. The lead for gate 3 has an outer peripheral shape greater than the electrode for gate 104 of the semiconductor chip 1. The lead for gate 3 extends to transverse a side of the semiconductor chip 1 between inside and outside of the semiconductor chip 1. The connecting member for gate 2 covers substantially the whole of the electrode for gate 104 in a manner different from, for example, a case in which the plurality of electrically conductive bumps (solder bumps, stud bumps, or the like) are distributed thereon.

Figure 3:
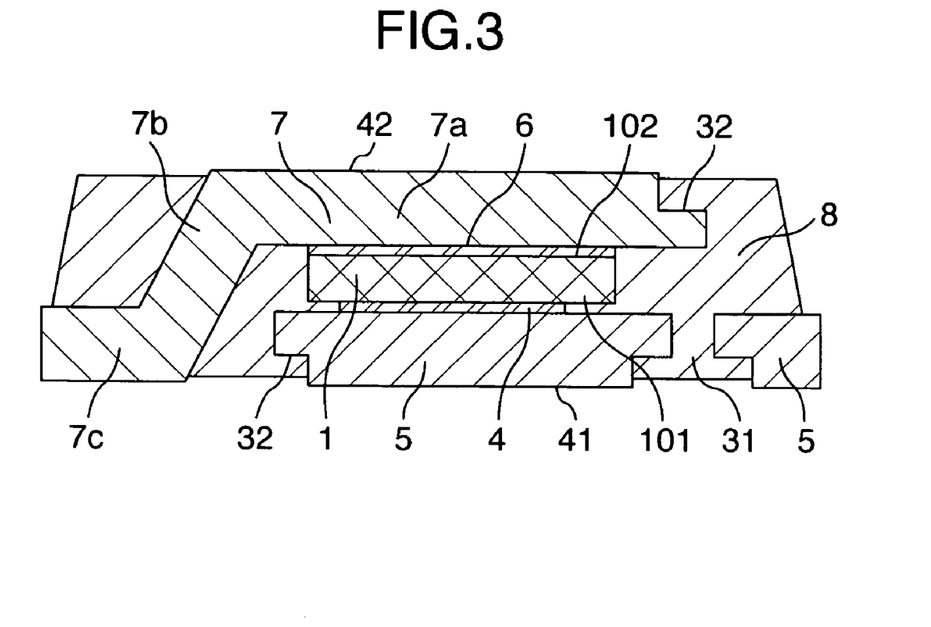
FIG. 3 is a cross sectional view showing a modified one of the first embodiment of the semiconductor device.

In this case, each of the connecting members (connecting member for gate, connecting member for source 4, connecting member for drain 6) is, for example, a high-temperature solder member (Pb5Sn) of high adhering strength. The semiconductor chip 1, each of the electrically conductive members (lead for drain 7, header for source 5, lead for gate 3) and each of the connecting members are sealed with the resin sealing member 8, while the header for source 5 projects from a resin surface 41 to be exposed, and the lead for drain 7 projects from a resin surface 42 to be exposed. A material of each of the electrically conductive members (lead for drain, header for source, lead for gate) is a copper alloy of high thermal conductivity for increasing a heat radiation. The semiconductor device of the embodiment has a structure in which the surface 41 on which the header for source 5 is exposed is connected to a land portion of a not-shown mounting substrate. Further, an end of each of the electrically conductive members (lead for drain, header for source, lead for gate) has a step 32 to increase an adhering strength between each electrically conductive member and the resin sealing member 8. Further, as shown in FIG. 3, a part of the header for source at which the header for source 5 and the resin sealing member 8 contact each other may has a hole 31 to further increase the adhering strength between the header for source 5 and the resin sealing member 8.

In the semiconductor device of the embodiment, since the electrically conductive members (lead for drain, header for source, lead for gate) between which the semiconductor chip 1 is arranged is exposed on both surfaces (upper and lower surfaces) of the semiconductor device (the resin sealing member 8), a heat energy can be effectively discharged from front and reverse surfaces (upper and lower surfaces opposed to each other) of the semiconductor device through the electrically conductive members. Further, since the header for source 5 rather than the electrode of the semiconductor device 1 is mounted on the substrate, an amount of applied solder is increased to improve a reliability of mounting and the solder can be inspected visually.

In the semiconductor device of the first embodiment, a projected area of the first part 7a of the lead for drain 7 covers fully a projected area of the semiconductor chip 1, and a projected area of the header for source 5 covers at least two sides of a projected area of the semiconductor chip 1 joined with each other. Further, the projected area of the first part 7a of the lead for drain 7 covers fully a projected area of the electrode for drain 106 of the semiconductor chip 1, and the projected area of the header for source 5 covers at least two sides of a projected area of the electrode for source 105 of the semiconductor chip 1 joined with each other.

Figure 5:
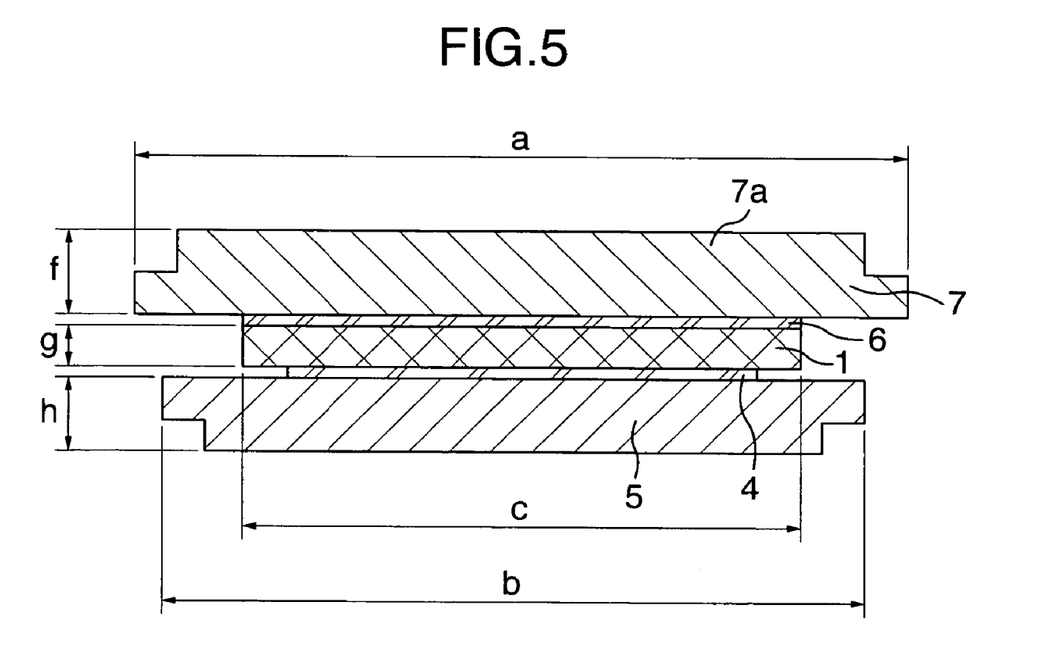
FIG. 5 is a cross sectional view of the semiconductor device taken along a line V-V in FIG. 1.

Next, a cross section taken along C-C' in FIG. 1 is shown in FIG. 5. In the C-C' cross section, a width of the header for source 5 (a width of the semiconductor chip 1 in a longitudinal direction thereof) becomes maximum. In this case, the width of the semiconductor chip 1 (the width of the semiconductor chip 1 in the longitudinal direction thereof) is c, a width of the first part 7a of the lead for drain 7 (a width in the longitudinal direction of the semiconductor chip 1) is a, a, and a width of the header for source 5 (a width in the longitudinal direction of the semiconductor chip 1) is b. In the invention, as shown in FIG. 5, the width a of the first part 7a of the lead for drain 7 and the width b of the header for source 5 are greater than the width c of the chip. This is for preventing a chip crack when being heated to a high temperature.

Figure 6:
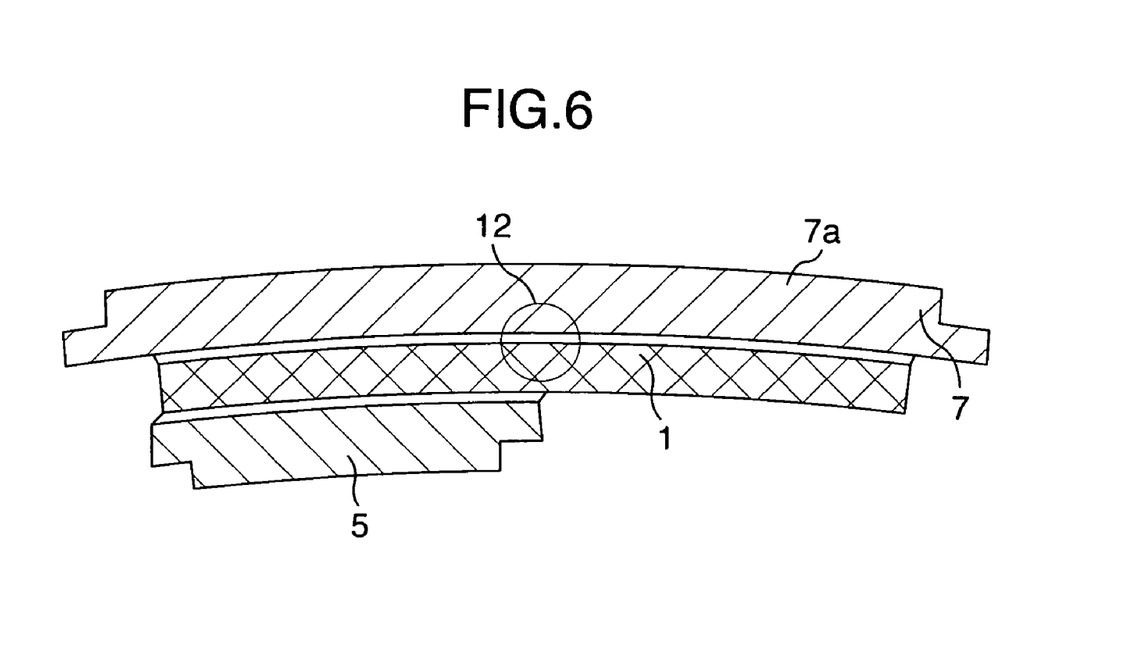
FIG. 6 is a cross sectional view showing a deformed situation of the semiconductor device when being heated to a high temperature.

A mechanism in which the chip crack occurs is explained. A linear expansion coefficient of the semiconductor chip 1 of silicon is small value of about $3 \times 10^{-6}$ (1/° C.), and a linear expansion coefficient of the electrically conductive members (lead for drain, header for source, lead for gate) is great value of about $17 \times 10^{-6}$ (1/° C.). In FIG. 5, when the width a is greater than the width c, the width b is smaller than the width c, and the semiconductor device is heated to the high temperature, since an expansion amount of the lead for drain 7 (the first part 7a) of great linear expansion coefficient is great, an upwardly convex deformation as shown in FIG. 6 occurs. Therefore, since a bending stress is concentrated at ○ mark portion 12 in the vicinity of a center of the semiconductor chip 1 to generate the maximum stress, the occurrence of the chip crack is considerable. A main reason of the occurrence of the great stress on the chip is a great difference between the width a of the first part 7a of the lead for drain and the width b of the header for source. Further, similarly, a difference in thickness between the lead for drain (the first part 7a) and the header for source 5 causes the bending stress in the semiconductor chip to generate the chip crack.

In the invention, since the width a of the lead for drain 7 (the first part 7a) and the width b of the header for source 5 are greater than the width c of the chip, the stress generated in the chip when the semiconductor device is heated to the high temperature is decreased to prevent the chip crack.

Further, the width a of the lead for drain 7 (the first part 7a) and the width b of the header for source 5 is made greater than a width e of the electrode for source 105 (in the longitudinal direction of the semiconductor chip 1) of the semiconductor chip 1.

By using the above mentioned structure, the deformed amount of the bent chip when being heated to the high temperature is decreased to restrain the stress generated in the chip.

Further, the width a of the lead for drain 7 (the first part 7a) and the width b of the header for source 5 may be made smaller than a difference between the width a and the width c of the semiconductor chip 1 and a difference between the width b and the width c. In this structure, the width a of the lead for drain 7 (the first part 7a) and the width b of the header for source 5 can be made substantially equal to each other to further decrease the stress generated in the chip.

Figure 7:
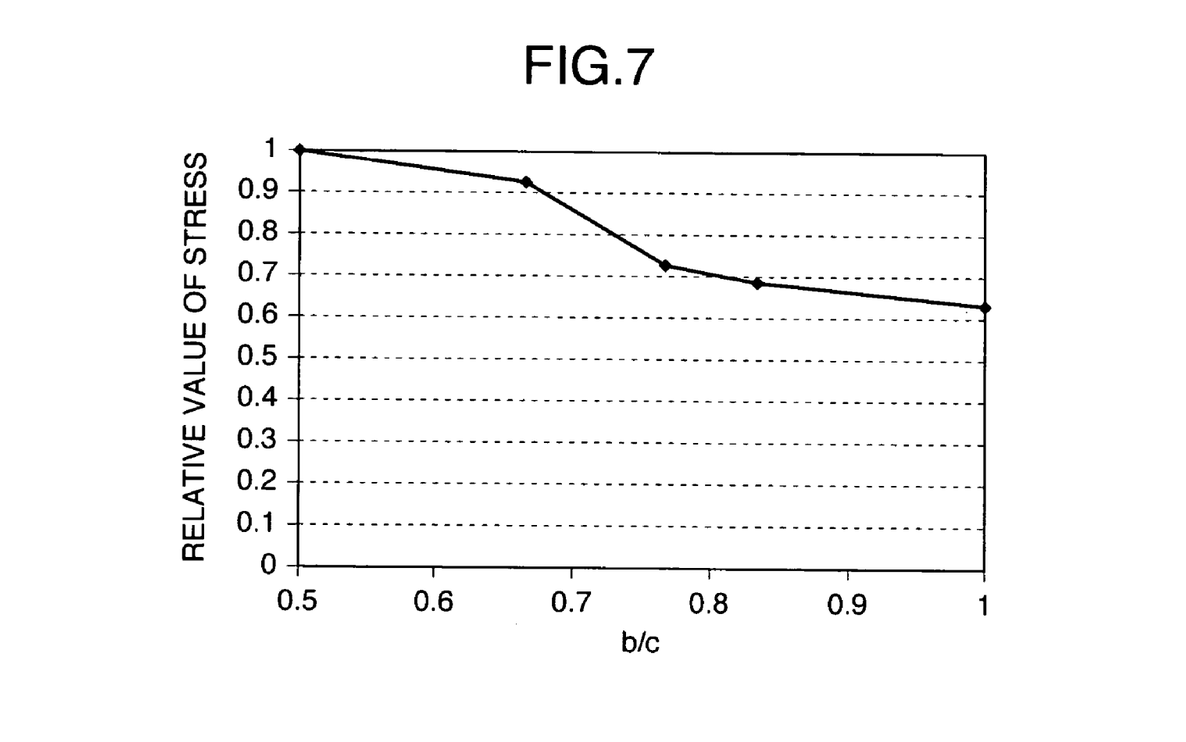
FIG. 7 is a diagram showing a relationship between a ratio b/c (header width/semiconductor chip width) and a stress generated in the semiconductor chip.

In FIG. 7, a relationship between the stress generated in the chip and a ratio of the width b of the header for source 5/the width c of the semiconductor chip is shown. An abscissa corresponds to b/c, and an ordinate corresponds to a relative value of the generated stress in the chip, which relative value is 1 when b/c=0.5. Since the stress generated in the chip is significantly decreased when b/c is greater than 0.75, b/c may be set more than 0.75.

Further, in the invention, a difference between a thickness f of the lead for drain 7 (the first part 7a) and a thickness h of the header for source 5 is made smaller than a difference between the thickness f and a thickness g of the semiconductor chip 1. By using this structure, the thickness of the lead for drain 7 (the first part 7a) and the thickness of the header for source 5 can be made substantially equal to each other to decrease the stress generated in the chip.

Next, in the invention, the thickness g of the chip is made smaller than the thickness f of the lead for drain 7 (the first part 7a) and the thickness h of the header for source 5. This is for preventing a fatigue breakage of the connecting member for source 4 and the connecting member for drain 6 during a temperature cycle test. Our research clarified that a strain generated in the connecting member for source 4 and the connecting member for drain 6 during the temperature cycle test varies in accordance with a variation of the thickness g of the chip. Incidentally, by decreasing the thickness g of the chip, the stress generated in the semiconductor chip 1 when being heated to the high temperature increases, but its sensitivity is small so that a level for generating the chip crack is not obtained.

Embodiment 2

Figure 8:
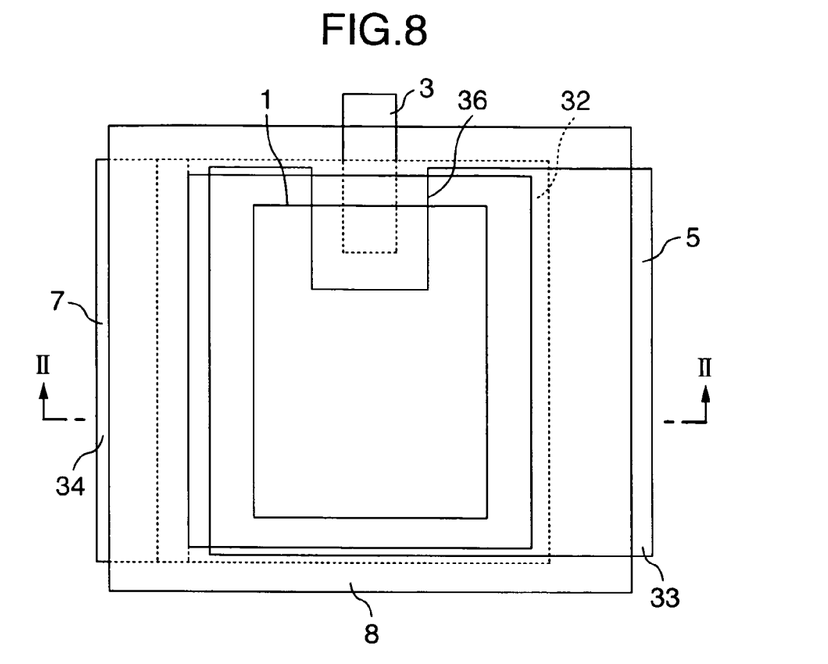
FIG. 8 is a front perspective view of another semiconductor device as a second embodiment of the invention.

FIG. 8 is a perspective plane view of a semiconductor device as a second embodiment of the invention. FIG. 2 is a cross sectional view taken along II-II in FIG. 8. FIGS. 4a and 4b are plane view and bottom view showing schematically a structure of a semiconductor chip 1 usable in the semiconductor device. Incidentally, since the basis structure of the second embodiment is equal to the structure of the first embodiment, a difference therebetween is described hereafter.

Figure 9A:
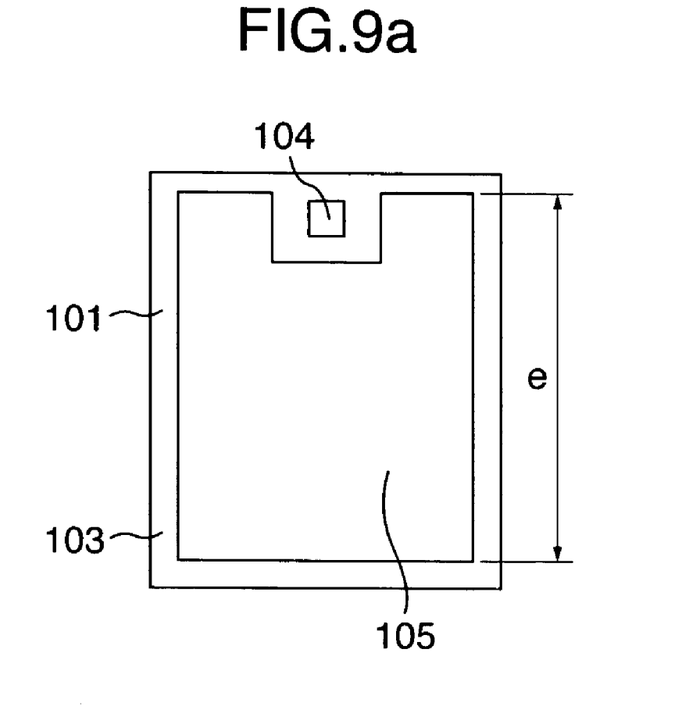
FIG. 9a is a front view of a semiconductor chip used in the second embodiment.
Figure 9B:
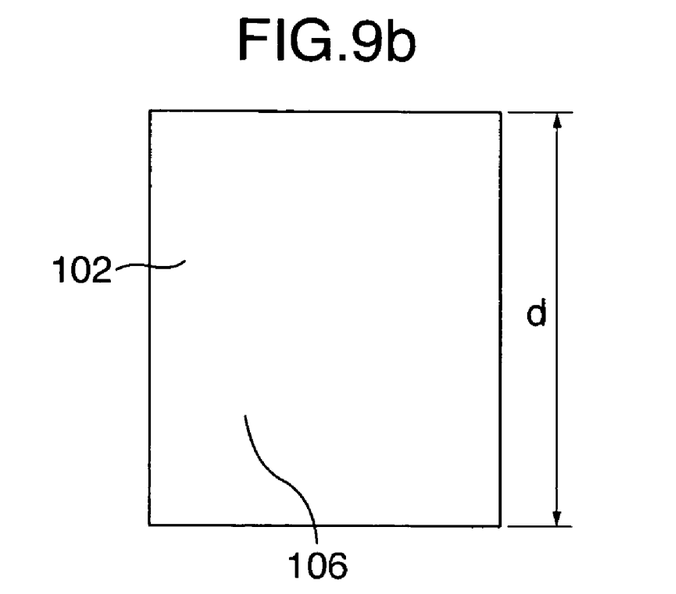
FIG. 9b is a reverse view of the semiconductor chip.

At first, with using FIG. 9, the semiconductor chip 1 is explained. As shown in FIG. 9a, the main surface 101 of the semiconductor chip 1 has the insulating protective layer 103, electrode for gate 104, and electrode for source 105. The electrode for gate 104 and electrode for source 105 are separated away from the peripheral edge (side) of the semiconductor chip 1, and the protective layer 103 is arranged between the peripheral edge of the semiconductor chip 1 and the electrode for source 105 and between the electrode for gate 104 and the electrode for source 105. The electrode for source 105 extends along three sides of the electrode for gate 104. As shown in FIG. 9b, the electrode for drain 106 is formed on the whole of the reverse surface 102 opposite to the main surface 101 of the semiconductor device.

Next, with using FIGS. 8 and 2, the whole structure of the semiconductor device is explained. Each of electrodes (electrode for gate 104, electrode for source 105, electrode for drain 106) of the semiconductor chip 1 are electrically and mechanically connected to corresponding one of the lead for gate 3, header for source 5 and lead for drain 7 through corresponding one of a connecting member for gate (not shown), the connecting member for source 4 and connecting member for drain 6. As shown in FIG. 8, the lead for gate 3 is arranged on a side other than sides on which a terminal 34 of the lead for drain 7 and a terminal 33 of the header for source 5 are arranged. The header for source 5 has a notch 36 extending along three sides of the lead for gate 3. In the semiconductor device of this embodiment, a width of the terminal 33 of the header for source 5 can be expanded to be equal to the width of the terminal of the lead for drain 7 so that a heat radiation characteristic is improved and a resistance value of the semiconductor device is decreased. Further, as shown in FIG. 9, by arranging the electrode for gate 104 substantially on a symmetrical axis of the semiconductor chip 1, the semiconductor chip 1 can be arranged at a substantial center of the semiconductor device irrespective of a size of the semiconductor chip 1, so that the lead frame is commonly usable to decrease a cost.

Embodiment 3

Figure 10:
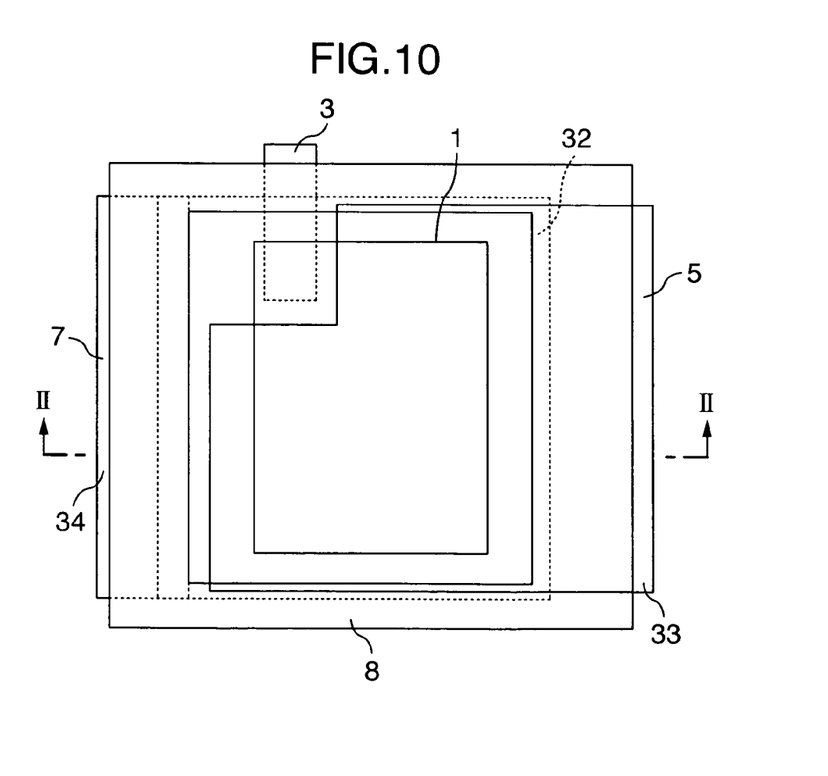
FIG. 10 is a front perspective view of another semiconductor device as a third embodiment of the invention.

FIG. 10 is a perspective plane view of a semiconductor device as a third embodiment of the invention. FIG. 2 is a cross sectional view taken along II-II in FIG. 10. Incidentally, since the basis structure of the third embodiment is equal to the structure of the first embodiment, a difference therebetween is described hereafter.

As shown in FIG. 10, the lead for gate 3 is arranged on the side other than the sides on which the terminal 34 of the lead for drain 7 and the terminal 33 of the header for source 5 are arranged. In this structure, the width of the terminal 33 of the header for source 5 can be expanded to be equal to the width of the terminal of the lead for drain 7 so that the heat radiation characteristic is improved and the resistance value of the semiconductor device is decreased.

Embodiment 4

Figure 11:
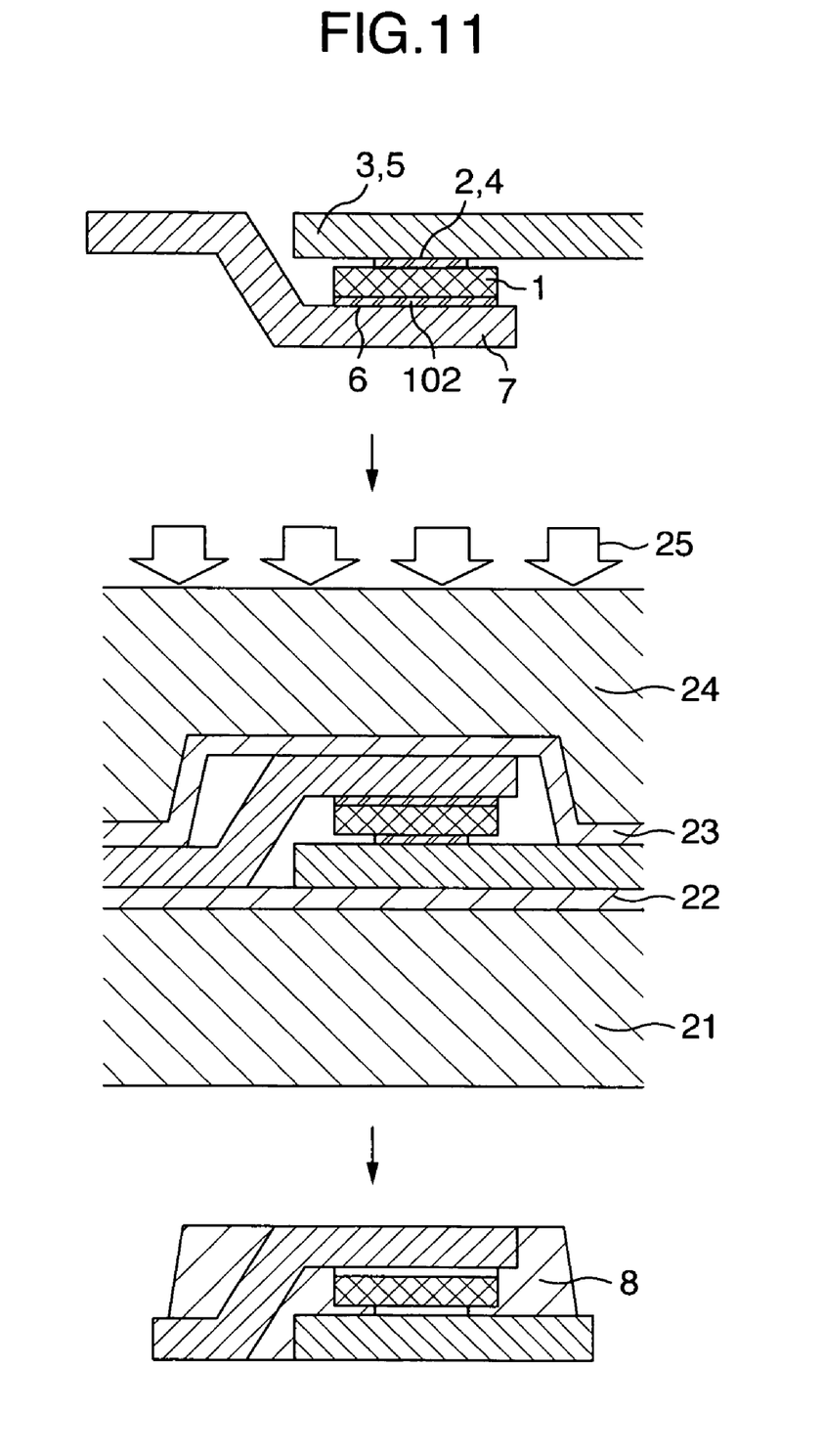
FIG. 11 includes views showing a process for producing the semiconductor device of the invention.

An example of a process for producing the semiconductor device as shown in the first, second and third embodiments is shown in FIG. 11. Incidentally, the views of this process are cross sectional views taken along line II-II in FIG. 1. In a step of an upper most view in FIG. 11, the lead for drain 7 is coated with the connecting member for drain 6, the semiconductor chip 1 is arranged thereon with its reverse surface 102 arrange downward, it is coated with the connecting member for source 4 and connecting member for gate 2, and the lead for gate 3 and header for source 5 are arranged thereon. In this case, each of the connecting members 2, 4 and 6 is, for example, high temperature solder member (Pb5Sn). After joining each of the connecting member (lead for drain 7, header for source 5, lead for gate 3) with the semiconductor chip 1, a total reflow is performed to fix the semiconductor chip 1 to each of the electrically conductive members.

In a step of a middle view, the semiconductor device after reflowing is arranged on a lower molding die 21 through a buffering member 22. An upper molding die with a buffering member 23 is arranged thereon and a cramping pressure 25 is applied. A resin is injected from a not-shown injection port to seal with the resin.

In a step of a lowermost view, the molding dies are removed and each of the electrically conductive members are cut.

Figure 12:
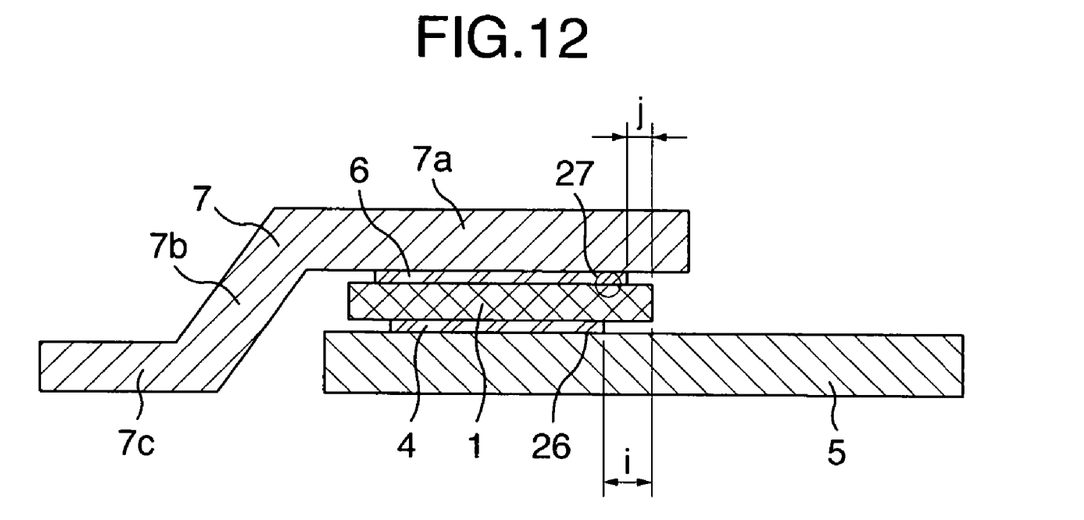
FIG. 12 is a cross sectional view showing another semiconductor device as a fourth embodiment of the invention.

FIG. 12 shows a cross section of the semiconductor device. A distance between the end of the semiconductor chip 1 and the connecting member for source 4 is i, and a distance between the end of the semiconductor chip 1 and the connecting member for drain 6 is j. In the invention, a difference between the width i and the width j is equal to the width i and the width j or less than the width i and the width j.

This is for preventing the chip crack during the production process of the semiconductor device. A mechanism of occurrence of the chip crack is explained. In the semiconductor device of the invention, the lead for drain 7 (the first part 7a) and the header for source 5 need to be exposed with respect to the resin sealing member 8. Therefore, the buffer member contacts directly the lead for drain 7 and the header for source 5. When the cramping pressure is applied in this situation, a significantly great force is applied to the electrically conductive members in comparison with a case in which a sealing resin of fluid is arranged between the buffer member and the electrically conductive members. Therefore, when the distance i is longer than the distance j as shown in FIG. 12, a bending stress on a fulcrum of the end 26 of the connecting member 4 occurs at the ○ mark part 27 of the semiconductor chip 1 so that the chip crack is generated. Therefore, in the invention, for preventing the chip crack caused by the clamping pressure in the resin molding process, the difference between the width i and the width j is made equal to the width i and the width j or less than width i and the width j. Whereby, since the width i and the width j are made equal to each other, the bending stress generated in the semiconductor chip 1 is suppressed when the clamping pressure is applied.

Figure 13A:
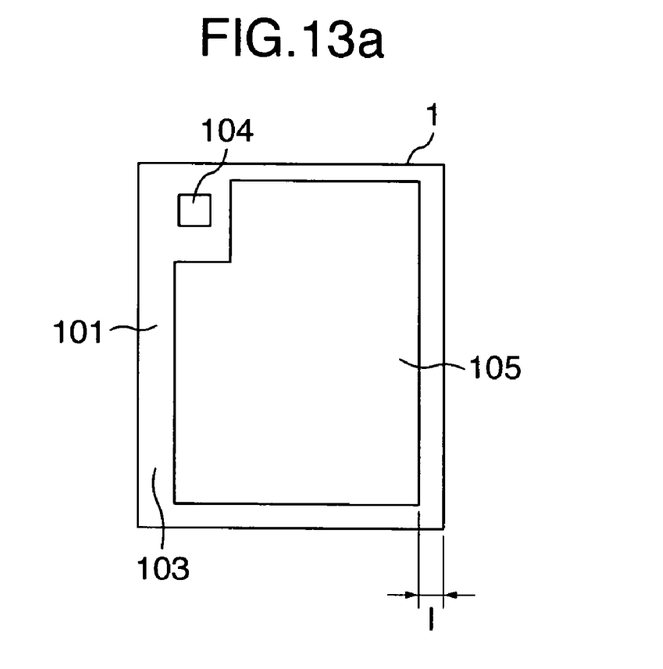
FIG. 13a is a front view of a semiconductor chip used in the fourth embodiment.
Figure 13B:
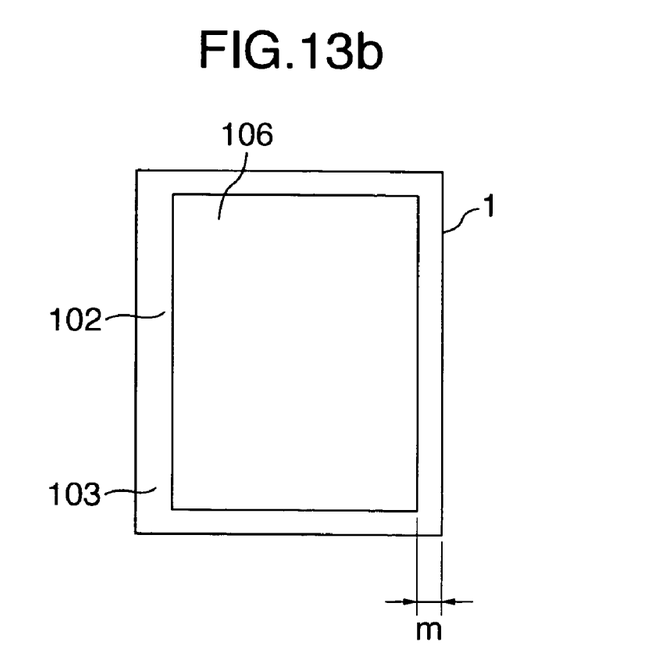
FIG. 13b is a reverse view of the semiconductor chip.

Further, another embodiment as described below should be considered. FIG. 13a is a plane view showing schematically a structure of the semiconductor chip 1, and FIG. 13b is a bottom view showing schematically a structure of the semiconductor chip 1. As shown in FIG. 13a, the structure of the main surface 101 of the semiconductor chip 1 is the same as FIG. 4. As shown in FIG. 13b, the reverse surface 102 of the semiconductor chip 1 has the insulating protective layer 103 and the electrode for drain 106. The protective layer 103 is arranged between the peripheral edge (side) of the semiconductor chip 1 and the electrode for drain 106.

As shown in FIGS. 13a and 13b, when a distance between the end of the semiconductor chip 1 and the electrode for source 105 is l, a distance between the end of the semiconductor chip 1 and the electrode for drain 106 is m, a difference between the width l and the width m is made equal to the width l and the width m or less than the width l and the width m. Whereby, since the width l and the width m are substantially equal to each other, the bending stress generated in the semiconductor chip 1 is suppressed when the clamping pressure is applied.

Figure 14:
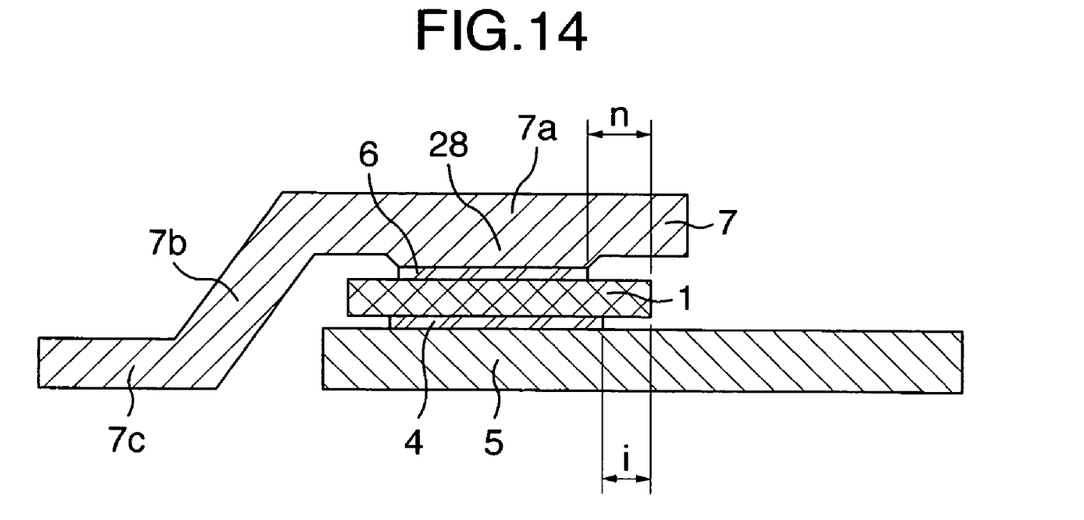
FIG. 14 is a cross sectional view showing another semiconductor device as a fifth embodiment of the invention.

Further, another embodiment as described below should be considered. As shown in FIG. 14, the part (the first part 7a) of the lead for drain 7 joined with the semiconductor chip 1 has a protrusion 28 projecting toward the semiconductor ship 1. The lead for drain 7 and the semiconductor ship 1 are joined with each other through the protrusion 28. When a distance between the end of the semiconductor chip 1 and the protrusion 28 is n, a difference between the width i and the width n is made equal to the width i and the width n or less than the width i and the width n. Whereby, since the width i and the width n which are not coated with the connecting member are made substantially equal to each other, the bending stress generated in the semiconductor chip 1 is suppressed when the clamping pressure is applied.

The invention of the inventors is described above concretely on the basis of the before mentioned embodiments, however the invention is not limited to the before mentioned embodiments, and can be modified variously in a scope in which the substance of the invention is kept.

For example, although the embodiment in which the electrode for source 105 and electrode for gate 104 of the semiconductor chip 1 are arranged at the lower side thereof (positioned at the mounting side of the semiconductor device) is explained, the invention is applicable to a case in which the electrode for drain 106 of the semiconductor chip 1 is arranged at the lower side thereof (positioned at the mounting side of the semiconductor device).

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising,
a semiconductor chip including first and second surfaces opposed to each other in a thickness direction of the semiconductor chip, wherein the first and second surfaces include first and second electrode surfaces respectively,
first and second electrically conductive members covering the first and second electrode surfaces respectively as seen in the thickness direction to be electrically connected to the first and second electrode surfaces respectively; and a sealing member fixed to at least a part of each of the semiconductor chip, the first electrically conductive member, and the second electrically conductive member, wherein each of the first and second electrically conductive members has an electrically conductive member body and an electrically conductive joint member between the electrically conductive member body and respective ones of the first and second electrode surfaces, a melting point of the electrically conductive joint member being lower than that of the electrically conductive member body, and wherein in a cross section passing the semiconductor chip and the first and second electrically conductive members taken along an imaginary plane parallel to the thickness direction, a difference between a distance between an innermost of a surface of the electrically conductive joint member of one of the first and second electrically conductive members which surface contacting the sealing member and a terminating end of the semiconductor chip in a direction perpendicular to the thickness direction and another distance between an innermost of a surface of the electrically conductive joint member of the other one of the first and second electrically conductive members which surface contacting the sealing member and the terminating end of the semiconductor chip in the direction perpendicular to the thickness direction is not more than the smaller one of the distance and the another distance.

2. A semiconductor device according to claim 1, wherein a surface of a part of each of the first and second electrically conductive members which part overlaps respective one of the first and second electrode surfaces as seen in the thickness direction and which surface is opposed to the respective one of the first and second electrode surfaces in the thickness direction is prevented from being fixed to the sealing member.

3. A semiconductor device according to claim 1, wherein a surface of a part of at least one of the first and second electrically conductive members which part overlaps corresponding one of the first and second electrode surfaces as seen in the thickness direction and which surface is opposed to the corresponding one of the first and second electrode surfaces in the thickness direction is prevented from being fixed to the sealing member.

4. A semiconductor device according to claim 1, wherein a terminating end of each of the first and second electrically conductive members in a direction perpendicular to the thickness direction has side surfaces opposed to each other in the thickness direction and an end surface extending in the thickness direction between the side surfaces, and the side surfaces and the end surface are fixed to the sealing member.

5. A semiconductor device according to claim 1, wherein a terminating end of at least one of the first and second electrically conductive members in a direction perpendicular to the thickness direction is stair-shaped so that both surfaces of the terminating end opposite to each other through the at least one of the first and second electrically conductive members in the thickness direction and extending in the direction perpendicular to the thickness direction are fixed to the sealing member.

6. A semiconductor device according to claim 1, wherein the sealing member is arranged between the semiconductor chip and a part of at least one of the first and second electrically conductive members in the thickness direction and is fixed to the semiconductor chip and the part of the at least one of the first and second electrically conductive members, so that the sealing member, the semiconductor chip and the part of the at least one of the first and second electrically conductive members overlap each other at least partially as seen in the thickness direction.

7. A semiconductor device according to claim 1, wherein the sealing member is arranged between the first and second electrically conductive members in the thickness direction so that the sealing member adjacent to the semiconductor chip and the first and second electrically conductive members overlap each other as seen in the thickness direction.

8. A semiconductor device according to claim 1, wherein a thickness of a part of each of the first and second electrically conductive members which part overlaps respective one of the first and second electrode surfaces as seen in the thickness direction is greater than a thickness of the semiconductor chip.

9. A semiconductor device according to claim 1, wherein a thickness of a part of the electrically conductive member body of at least one of the first and second electrically conductive members which part overlaps corresponding one of the first and second electrode surfaces as seen in the thickness direction is greater than a thickness of another part of the electrically conductive member body of the at least one of the first and second electrically conductive members which another part is prevented from overlapping the corresponding one of the first and second electrode surfaces as seen in the thickness direction.

10. A semiconductor device comprising:

a semiconductor chip including a first and second surfaces opposed to each other in a thickness direction of the semiconductor chip, wherein the first and second surfaces include first and second electrode surfaces respectively; and first and second electrically conductive members covering the first and second electrode surfaces respectively as seen in the thickness direction to be electrically connected to the first and second electrode surfaces respectively, wherein in a cross section passing the semiconductor chip and the first and second electrically conductive members and taken along an imaginary plane parallel to the thickness direction, a difference between a distance between an outer periphery of one of the first and second electrode surfaces and a terminating end of the semiconductor chip in a direction perpendicular to the thickness direction and another distance between an outer periphery of the other one of the first and second electrode surfaces and the terminating end of the semiconductor chip in the direction perpendicular to the thickness direction is not more than a smaller one of the distance and the another distance.

11. A semiconductor device according to claim 1, wherein a difference between a thickness of a part of one of the first and second electrically conductive members which part covers corresponding one of the first and second electrode surfaces as seen in the thickness direction and another thickness of a part of the other one of the first and second electrically conductive members which part covers the other corresponding one of the first and second electrode surfaces as seen in the thickness direction is smaller than a difference between the thickness of the semiconductor chip and at least one of the thickness of the part of the one of the first and second electrically conductive members and the another thickness of the part of the other one of the first and second electrically conductive members.

12. A semiconductor device according to claim 1, wherein at least one of the first and second electrically conductive members overlaps substantially the whole of the semiconductor chip as seen in the thickness direction.

13. A semiconductor device according to claim 1, wherein at least one of the first and second electrically conductive members overlaps substantially the whole of corresponding one of the first and second electrode surfaces as seen in the thickness direction.

14. A semiconductor device according to claim 1, wherein at least one of the first and second electrically conductive members traverses an outer periphery of the semiconductor chip in two directions perpendicular to each other as seen in the thickness direction.

15. A semiconductor device according to claim 1, wherein at least one of the first and second electrically conductive members traverses an outer periphery of corresponding one of the first and second electrode surfaces in two directions perpendicular to each other as seen in the thickness direction.

16. A semiconductor device according to claim 1, wherein parts of the first and second electrically conductive members traverse an outer periphery of the semiconductor chip as seen in the thickness direction, and a thickness of each of the parts of the first and second electrically conductive members is greater than a thickness of the semiconductor chip.

17. A semiconductor device according to claim 1, wherein the semiconductor chip includes a transistor therein, and one of the first and second electrode surfaces is usable as a drain electrode, and the other one of the first and second electrode surfaces is usable as a source electrode.

18. A semiconductor device according to claim 1, wherein the first and second electrically conductive members extend in the thickness direction so that at least one of the first and second electrically conductive members overlaps fully a thickness of the semiconductor chip as seen in a direction perpendicular to the thickness direction and the first and second electrically conductive members overlap each other at least partially as seen in the direction perpendicular to the thickness direction.

* * * * *